United States Patent
Ao et al.

(10) Patent No.: US 9,160,046 B2
(45) Date of Patent: Oct. 13, 2015

(54) REDUCED EMI WITH QUARTER WAVELENGTH TRANSMISSION LINE STUBS

(71) Applicant: Lenovo Enterprise Solutions (Singapore) Pte. Ltd., Singapore (SG)

(72) Inventors: Eric R. Ao, Nepean (CA); Donald R. Dignam, Ottawa (CA); Stephen J. Flint, Ottawa (CA); Jian Meng, Kanata (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/135,131

(22) Filed: Dec. 19, 2013

(65) Prior Publication Data
US 2015/0180107 A1    Jun. 25, 2015

(51) Int. Cl.
H03H 7/01 (2006.01)
H01P 1/212 (2006.01)
H01P 3/10 (2006.01)

(52) U.S. Cl.
CPC . H01P 1/212 (2013.01); H01P 3/10 (2013.01)

(58) Field of Classification Search
CPC .............................. H05K 3/005; H05K 1/115
USPC ............. 333/34, 246, 32, 238, 134, 126, 189, 333/175
See application file for complete search history.

(56) References Cited

U.S. PATENT DOCUMENTS

| | | | |
|---|---|---|---|
| 3,688,225 A | 8/1972 | Cohn | |
| 3,879,690 A | 4/1975 | Golant et al. | |
| 3,959,749 A | 5/1976 | Ikushima et al. | |
| 4,074,214 A | 2/1978 | Aichholzer | |
| 4,266,206 A | 5/1981 | Bedard et al. | |
| 5,291,161 A | 3/1994 | Saka | |
| 6,147,576 A | 11/2000 | Arevalo | |
| 7,825,754 B2 | 11/2010 | Kawai et al. | |
| 7,948,070 B2 * | 5/2011 | Chuang et al. | 257/678 |
| 8,106,728 B2 | 1/2012 | Ding et al. | |
| 8,866,563 B1 * | 10/2014 | Ben Artsi | 333/34 |
| 2011/0063790 A1 * | 3/2011 | Park et al. | 361/679.31 |
| 2012/0007689 A1 | 1/2012 | Zhang | |
| 2012/0169436 A1 | 7/2012 | Nusair | |
| 2014/0077896 A1 * | 3/2014 | Lee et al. | 333/185 |

OTHER PUBLICATIONS

Nakura et al., "Preliminary Experiments for Power Supply Noise Reduction Using On-Board Stubs" IEICE Transactions on Electronics (IEICE Trans Electron) (Japan) 2005 E88-C/8 (1734-1739).

* cited by examiner

*Primary Examiner* — Dinh Le
(74) *Attorney, Agent, or Firm* — Zilka-Kotab, PC

(57) ABSTRACT

Embodiments of the present invention provide for a transmission circuit that includes a transmission line and a conductive via. The transmission line is electrically coupled to a first conductive via and a second conductive via. The first conductive via includes a first via stub, wherein the transmission line is configured to transmit a signal that is coupled to the first conductive via, and wherein the first via stub extends beyond the transmission line. The second conductive via includes a second via stub, wherein the transmission line is configured to transmit a signal that is coupled to the second conductive via, and wherein the second via stub extends beyond the transmission line. A transmission line stub is electrically coupled to the transmission line or to at least one of the conductive vias, wherein the length of the transmission line stub is configured to suppress a preselected frequency.

17 Claims, 5 Drawing Sheets

REDUCED EMI WITH QUARTER WAVELENGTH TRANSMISSION LINE STUBS

FIELD OF THE INVENTION

The present invention relates generally to high speed digital circuit technology, and more particularly to reducing electromagnetic interference in high speed printed circuit board design.

BACKGROUND

Electromagnetic interference (EMI) is the generation of undesired electrical signals in electronic system circuitry when an electromagnetic (EM) wave in one electrical circuit, component or part is unintentionally transferred to another electrical circuit, component or part. As the size of electronic systems decreases, the density of electrical components in these systems increases, and the dimensions of circuit elements correspondingly decrease. As spacing decreases between circuit elements, the likelihood of interference from adjacent circuit elements increases. EMI is a common issue for most high frequency electronic products. With the increased circuit densities along with increased data rates, it is increasingly difficult to meet regulatory electromagnetic compatibility (EMC) requirements.

Electronic product manufacturers take several approaches to minimizing EMI for EMC compliance. Shielding products to prevent EM radiation is a common technique. At the system or board level metal cages or metal covers may be installed to prevent the radiation of electromagnetic waves causing EMI. While commonly done, this can be an awkward and costly solution to meeting EMC requirements. In smaller, portable devices running with higher frequencies, metal covers or shields may be hard to implement. In printed circuit board (PCB) design, placement of high frequency devices may be planned to avoid devices sensitive to EMI. Careful device placement may reduce the size of card covers used to reduce EMI. Designs that focus on suppression of unwanted electromagnetic radiation can provide a more cost effective solution to reducing EMI. Suppression of EMI before is it transmitted outside of the system or enclosure is critical to EMC compliance.

The generation of excess EM radiation in devices is problematic to other components within the electronic device and to other nearby electronic devices. Unwanted signals generated from excess EM radiation, from within a device and from nearby electronic devices, leads to EMI in electronic devices. For this reason regulatory committees exist both nationally and internationally to monitor and define limits of allowable EMI for various electronic devices. Requirements and tests are defined for EMC that monitor EM radiation causing EMI between systems and components for electronic devices.

SUMMARY

Embodiments of the present invention provide for a transmission circuit that includes a transmission line and a conductive via. The transmission line is electrically coupled to a first conductive via and a second conductive via. The first conductive via includes a first via stub, wherein the transmission line is configured to transmit a signal that is coupled to the first conductive via, and wherein the first via stub extends beyond the transmission line. The second conductive via includes a second via stub, wherein the transmission line is configured to transmit a signal that is coupled to the second conductive via, and wherein the second via stub extends beyond the transmission line. A transmission line stub is electrically coupled to the transmission line, wherein the length of the transmission line stub is configured to suppress a preselected frequency.

Other embodiments of the invention provide for a transmission circuit that includes a transmission line and a conductive via. The transmission line is electrically coupled to a first conductive via and a second conductive via. The first conductive via includes a first via stub, wherein the transmission line is configured to transmit a signal that is coupled to the first conductive via, and wherein the first via stub extends beyond the transmission line. The second conductive via includes a second via stub, wherein the transmission line is configured to transmit a signal that is coupled to the second conductive via, and wherein the second via stub extends beyond the transmission line. A transmission line stub that is electrically coupled to at least one of the first conductive via, or the second conductive via, wherein the length of the transmission line stub is configured to suppress a preselected frequency.

DETAILED DESCRIPTION

Figure 1A:
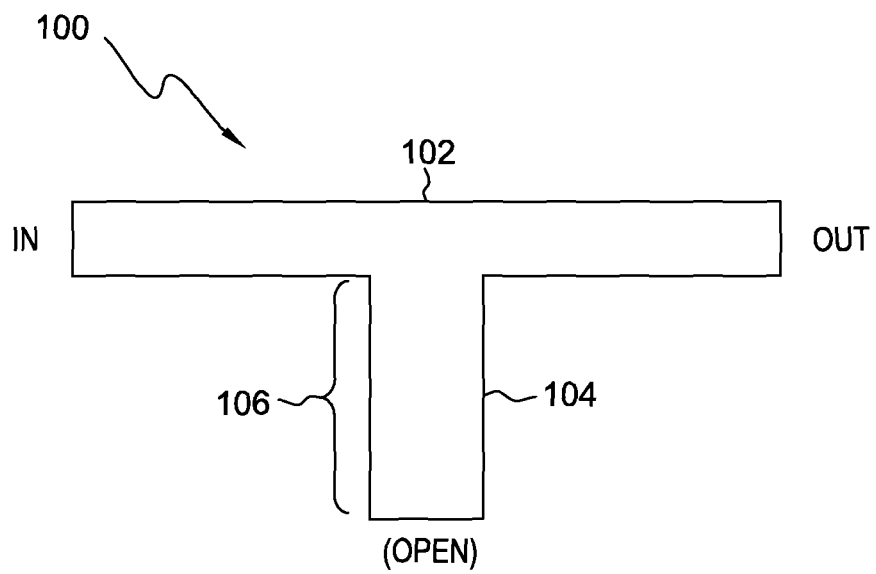
FIG. 1A illustrates a circuit in accordance with an embodiment of the invention.

Embodiments of the present invention provide methods and structures for suppression of electromagnetic waves using a transmission line stub technique. One skilled in the art will recognize that concepts developed in exemplary embodiments of the present invention could be applied to other multilayered circuit substrates, for example laminate chip carrier design, ceramic chip carrier design, flex cables, and other multilayer circuit substrates including semiconductor design applications. Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconducting layers at the interface of the two elements.

Printed circuit board technology typically consists of a non-conducting dielectric layer on which conductive layer may be laminated or deposited. A typical example is an epoxy impregnated glass cloth or similar dielectric material laminated with one or more layers of copper. Signal or transmission lines and power or ground planes may be etched or selectively plated on the layers. One or more layers of insulating and conductive materials that include transmission lines and/or power or ground planes may be laminated together forming a composite structure of the printed circuit board. Via holes may be drilled through the composite structure and filled or plated with a conductive material, such as silver filled epoxy, copper plating, or other conductive material. These conductive vias can make electrical connections between transmission lines included on different layers of the printed circuit board. A typical example of a conductive via is a plated through hole (PTH).

The transmission line stub technique described herein is used to suppress specific frequencies of common mode EM waves in a circuit which reduces the electromagnetic radiation produced by electronic devices. Moreover, suppression of a second harmonic frequency provides minimal impact to the signal integrity at a fundamental frequency. A transmission line with a quarter wavelength open stub can generate deep attenuation at a frequency determined by the full wavelength. The elimination of a targeted frequency or frequencies that are generating unwanted electromagnetic waves or noise in an electronic circuit aids in the reduction of EMI. EMI reduction is increasingly important in high speed, high frequency electronics products where miniaturization and portability drive much of the marketplace.

The transmission line stub technique described herein can be applied to numerous applications in electronics. The transmission line stub technique may be applied to PCB board design, flexible cable design, chip carrier design, chip design or other electronic components that can utilize transmission lines or differential pair transmission lines. The transmission line stub technique described requires little to no change to existing manufacturing lines and little additional cost to the component. The specific embodiments described herein address the application of this technique in PCB design; however, one skilled in the art can apply this concept to other electronic devices. For example, a flexible cable using a transmission line stub may be designed and manufactured. A flexible cable using the transmission line stub technique reduces noise from suppressed frequencies within a system and/or the EMI radiated outside of system when the flexible cable is used externally.

High frequency designs often require the use of differential signaling and differential signal pairs. A differential signal pair is a pair of substantially identical transmission lines that generally have constant spacing between each other, and are typically symmetrical to each other and their surrounding structures. The electrical properties of a differential pair, for example differential characteristic impedance, are defined by the geometric dimensions (thickness and width of trace, trace spacing, distance to reference planes, etc.) and the dielectric material surrounding the pair.

In most high speed signal interconnects, the use of differential signaling includes a differential transmitter, a differential receiver, and a differential data path including differential signal pairs, vias, and eventually connectors and cables. An ideal differential transmitter sends a set of two identical signals with opposite polarity. When this occurs, the amplitude of the differential mode which is the difference of the two signals is double that of the single signal while the AC amplitude of the common mode signal is ideally zero.

In a transmission line, there are both common mode and differential mode currents, both of which determine the amount of radio frequency (RF) energy that is developed and propagated. Both common mode and differential mode of currents usually exist in a differential transmission line. The differential mode current or signals carry the data or signal of interest (information). The common mode current which carries no useful information is a side effect or byproduct of the differential mode signal transmission. The common mode current or "noise" generates EM radiation which is troublesome for EMC compliance.

In designs using differential signaling, a true and an inverted signal are precisely established so that the differential mode currents will be cancelled out. Radiated emission for a differential mode current or signal is the component of RF energy that is present on both the signal and return paths that are opposite to each other in differential pairs. Common mode current is also present in both the signal and return paths. The RF field resulting from the common mode current is due to the sum of the currents that exist in both the signal and return path. This sum can be substantial since common mode currents lack differential mode cancellation effects.

A typical source of EMI is the common mode even harmonic radiation. The second harmonic radiation can be caused by imperfections of the output signals of the high frequency signal transmitter and is evident by a narrow spike in the emissions spectrum. Other sources of non-zero common mode AC amplitude include: differences in rise and fall times in single-ended signals, difference in duty cycle of single-ended signals, ground bounce, power plane fluctuations, and differential signals that are not precisely inverted where the portions of the signal that do no cancel out create common mode current.

The transmission line stub technique described herein targets the suppression of a specific common mode frequency in a circuit while substantially protecting the differential mode signal from attenuation at its working fundamental frequency. For example, the transmission line stub suppresses the even harmonic frequencies of the fundamental frequency of a circuit, in particular the second harmonic frequency. Utilizing this transmission line stub within a PCB structure can effectively suppress common mode noise while preserving the signal integrity of the differential mode signal. In particular, the transmission line stub can suppress common mode even harmonics radiation, empirically shown as a common source of EMI.

Referring now to the figures, FIG. 1A illustrates circuit 100 in accordance with an embodiment of the invention. Circuit 100 includes transmission line 102 and transmission line stub 104 electrically coupled to transmission line 102. Transmission line 102 includes an input end (IN) and an output end (OUT). Transmission line stub 104 is an unterminated (OPEN) transmission line with length 106. Transmission line stub 104 operates to suppress the amplitude of specific frequencies transmitted on transmission line 102. Specifically, transmission line stub 104 can suppress frequencies having an electrical wavelength that is four times the length of length 106 (i.e., length 106 is one quarter of the electrical wavelength of the transmitted, suppressed frequency). Selecting length 106 to be one quarter of the electrical wavelength of the second harmonic of the fundamental transmission line frequency can operate to suppress the energy around the second harmonic frequency, often associated with EM radiation as described above. The fundamental frequency of the transmission line can be determined as one half of the data rate on that transmission line. For example, if the data rate on a transmission line is 10 gigabits per second (Gbps), the fundamental frequency is 5 GHz. Alternatively, the fundamental frequency is equal to the inverse of the period of a clock signal, if the transmission line carries a clock signal rather than data. The second harmonic frequency is determined as twice the fundamental frequency. For example, the second harmonic frequency of a 5 GHz signal transmission is 10 GHz. The electrical wavelength is based on the frequency of a transmitted signal and the dielectric constant of the material(s) surrounding transmission stub 104 according to the equation:

$$\lambda = C/(f \times \sqrt{Er\,Eff})$$

where C=the speed of light in vacuum, f=frequency, and Er Eff=the effective dielectric constant. In various embodiments, the frequency used in this equation is the second harmonic frequency.

Figure 1B:
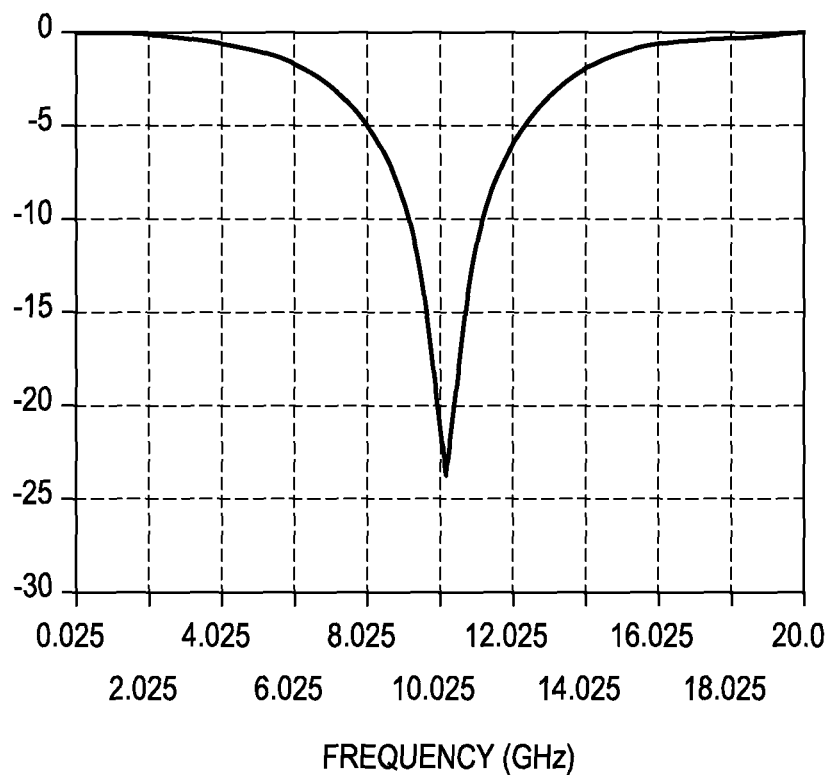
FIG. 1B depicts a plot simulating the insertion loss of a circuit of FIG. 1A in accordance with an embodiment of the invention.

FIG. 1B depicts a plot simulating the insertion loss of circuit 100 of FIG. 1A in accordance with an embodiment of the invention. The simulation is based on a targeted frequency of 10.3 GHz. Using the above equation, the electrical wavelength of a 10.3 GHz signal in air (effective dielectric constant=1) is 29.1 mm wherein the one quarter electrical wavelength is 7.3 mm. The simulation of circuit 100 plotted in FIG. 1B wherein length 106 of transmission line stub 104 is equal to 7.3 mm shows deep attenuation or suppression of the signal in and around 10.3 GHz.

Figure 2A:
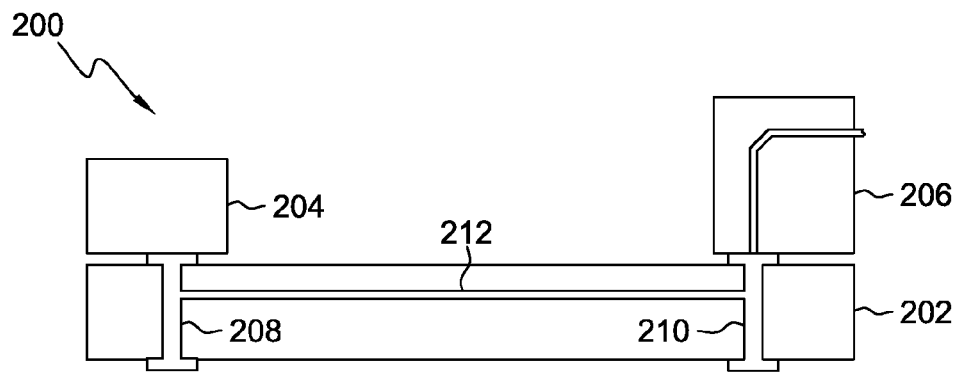
FIG. 2A illustrates a circuit assembly.

FIG. 2A illustrates circuit assembly 200. Circuit assembly 200 includes PCB 202, transmitter chip 204 and connector 206. PCB 202 includes plated through holes (PTHs) 208 and 210, and transmission line 212. Transmission line 212 is electrically coupled to PTH 208 and 210 forming a transmission circuit that operates to electrically couple transmitter chip 204 with connector 206. In this illustrative example, transmitter chip 204 is a 40 GbE (gigabit Ethernet) Ethernet switch operating with a data rate of 40 Gbps. Transmitter chip 204 uses four transmitter lanes wherein the data rate on each lane is 10.3125 Gbps and the fundamental frequency is 5.15625 GHz. The transmitter lane may be a differential pair of transmission lines. In other embodiments, the transmitter lane may be a single transmission line. Circuit assembly 200 can be modified in accordance with embodiments of the invention, to include transmission line stubs as discussed below with reference to FIGS. 3A and 4A.

Figure 2B:
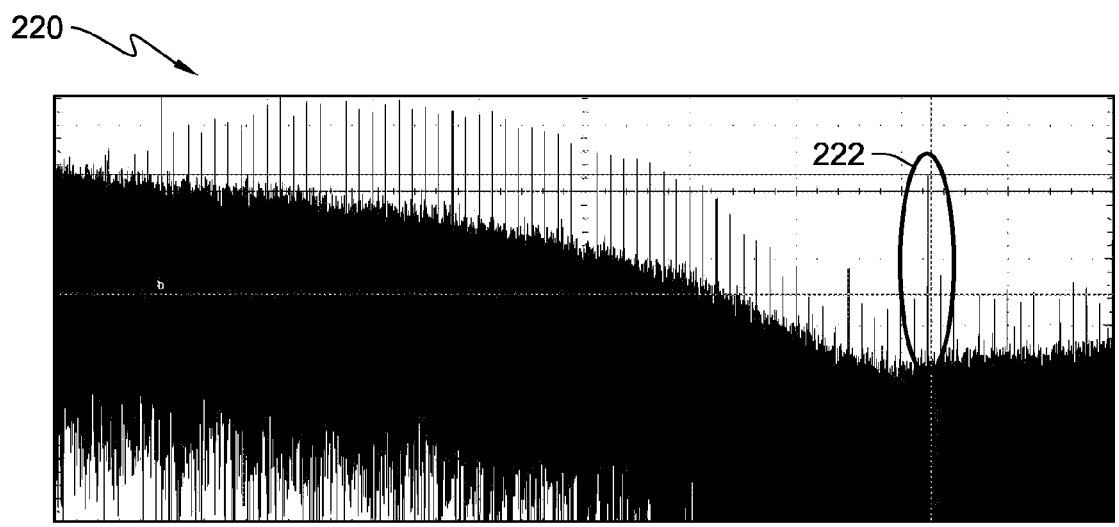
FIG. 2B shows spectrum analysis of a circuit assembly of FIG. 2A.

FIG. 2B shows conducted spectrum analysis 220 of circuit assembly 200 measured at connector 206. The conducted spectrum analysis plots the magnitude of an input signal versus frequency within a frequency range to measure the power of the spectrum of known and unknown signals. The display of a measured spectrum has frequency on the horizontal axis (in GHz) and the amplitude displayed on the vertical axis (in dBm). Conducted spectrum analysis 220 shows a high power peak 222 at 10.3125 GHz. This high power peak occurs at the second harmonic of the fundamental frequency. Circuit assembly 200 demonstrates increased EM radiation at 10.3125 GHz and common mode even harmonic radiation is a typical source of EMI.

Figure 3A:
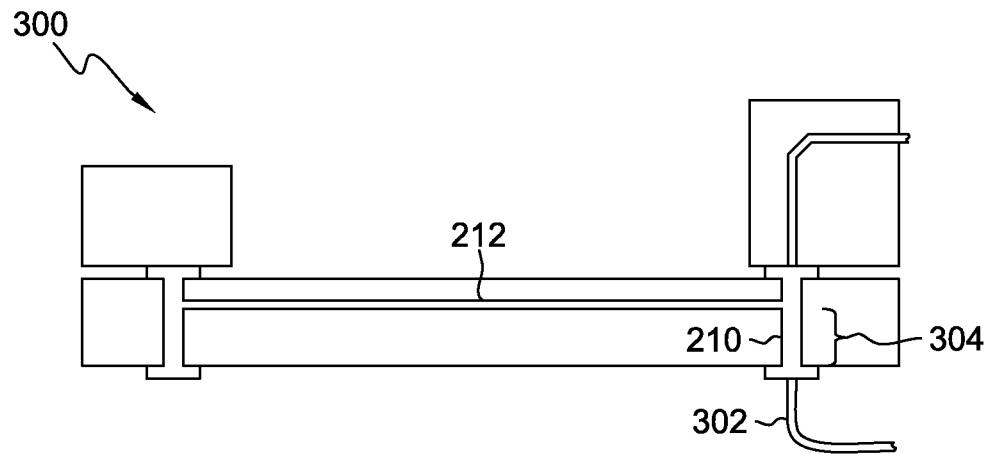
FIG. 3A illustrates a circuit assembly with a transmission line stub in accordance with an embodiment of the invention.

FIG. 3A illustrates circuit assembly 300 with transmission line stub 302 in accordance with an embodiment of the invention. Circuit assembly 300 is circuit assembly 200 with the addition of transmission line stub 302. In one embodiment, transmission line stub 302 is electrically coupled to via stub 304, an unterminated portion of PTH 210 of FIG. 2A. Portions of a conductive via extending beyond the inner layers of the PCB which are interconnected to other layers can form an unterminated via stub, for example, via stub 304. Calculation of the appropriate length of transmission line stub 302 includes considering the length of an unterminated portion of a PTH, such that the sum of the electrical length of transmission line stub 302 and via stub 304 equals one quarter the electrical wavelength of the second harmonic of the fundamental frequency of transmission line 212. It should be appreciated by someone skilled in the art that via stub 304 and transmission line stub 302 may be surrounded by different materials with different effective dielectric constants. The dielectric constant of the surrounding material affects the propagation speed of a transmitted signal. Thus, the propagation speed can be considered when composing the transmission line stub. As such, the lengths of via stub 304 and transmission line stub 302 can be determined based on time delay of each segment wherein the sum of the time delay of each segment equals one quarter cycle of the second harmonic of the fundamental frequency. Computer software programs, such as HFSS™ by Ansys Corporation, can calculate the time delays associated with via stub 304 and transmission line stub 302. As such, it should be understood that the combination of transmission line stub 302 and via stub 304 is analogous to transmission line stub 104 of FIG. 1A, and that the combined length of transmission line stub 302 and via stub 304 is analogous to length 106 of FIG. 1A.

Figure 3B:
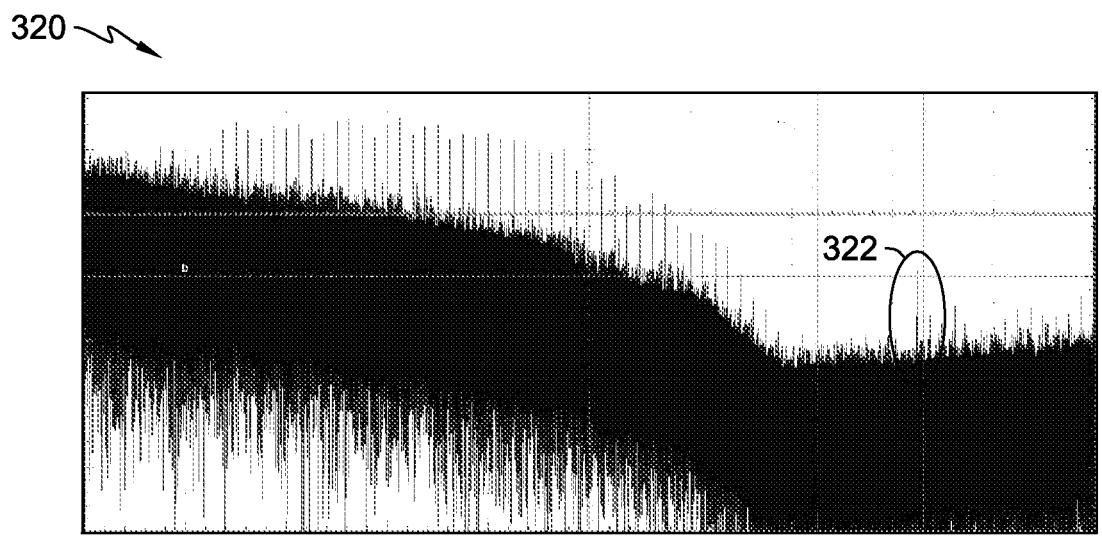
FIG. 3B shows spectrum analysis of a circuit assembly of FIG. 3A that includes a transmission line stub in accordance with an embodiment of the invention.

FIG. 3B shows conducted spectrum analysis 320 measured at the connector of circuit assembly 300 that includes transmission line stub 302 of FIG. 3A in accordance with an embodiment of the invention. Conducted spectrum analysis 320 shows a high power peak 322 at 10.3125 GHz such that the magnitude of high power peak 322 is suppressed compared to high power peak 222 of FIG. 2B. In this illustrative embodiment, the magnitude of high power peak 322 is reduced by approximately 8 dB compared to high power peak 222 of FIG. 2B. Circuit assembly 300 demonstrates reduced EM radiation at 10.3125 GHz compared to circuit assembly 200.

Figure 4A:
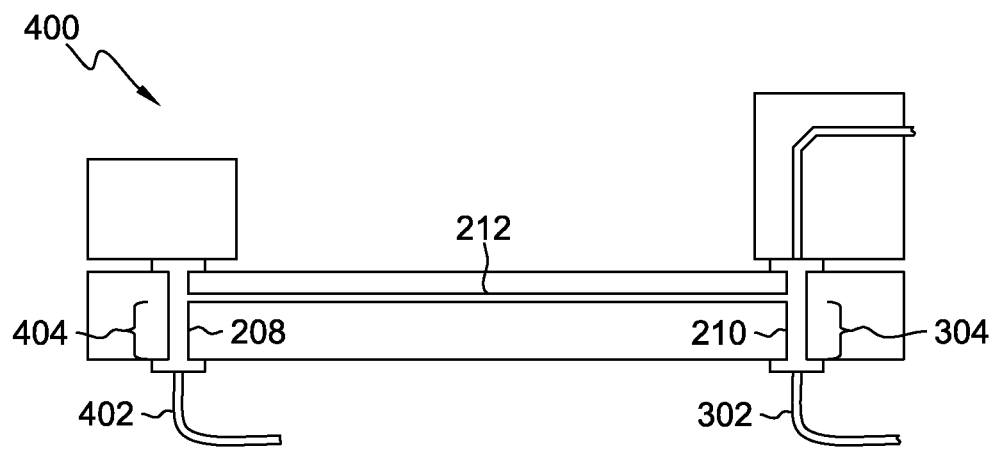
FIG. 4A illustrates a circuit assembly with a pair of transmission line stubs in accordance with an embodiment of the invention.

FIG. 4A illustrates circuit assembly 400 with a pair of transmission line stubs 302 and 402, in accordance with an embodiment of the invention. Circuit assembly 400 is circuit assembly 300 with the addition of transmission line stub 402. In one embodiment, transmission line stub 402 is electrically coupled to via stub 404, an unterminated portion of PTH 208 of FIG. 2A. The length of transmission line stub 402 can be determined as described above with reference to transmission line stub 302. In particular, it should be understood that the combination of transmission line stub 402 and via stub 404 is analogous to transmission line stub 104 of FIG. 1A, and that the combined length of transmission line stub 402 and via stub 404 is analogous to length 106 of FIG. 1A.

Figure 4B:
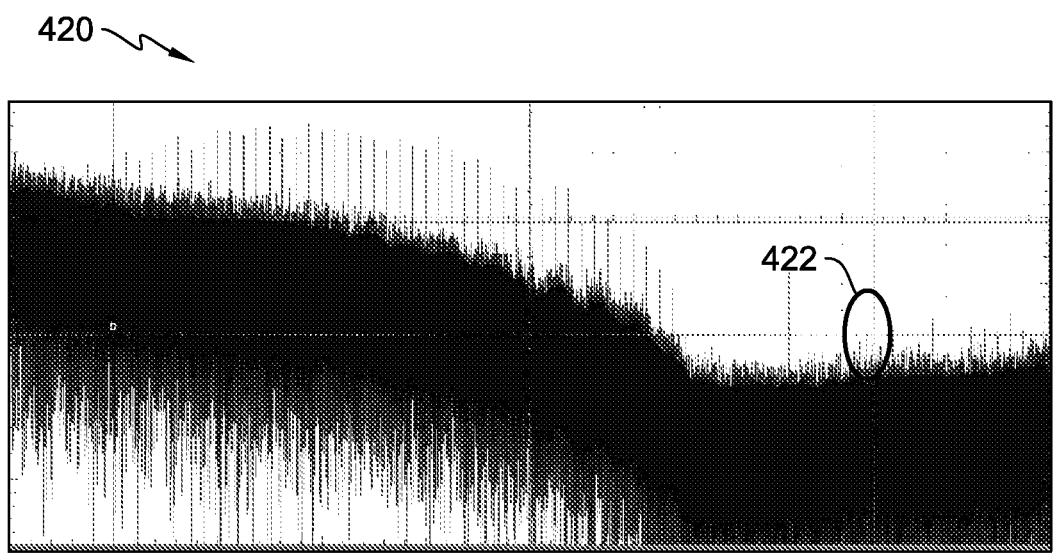
FIG. 4B shows a spectrum analysis of a circuit assembly of FIG. 4A that includes a pair of transmission line stub in accordance with an embodiment of the invention.

FIG. 4B shows conducted spectrum analysis 420 measured at the connector of circuit assembly 400 that includes a pair of transmission line stubs (transmission line stub 302 of FIG. 3A and transmission line stub 402 of FIG. 4A) in accordance with an embodiment of the invention. Conducted spectrum analysis 420 shows a reduced high power peak 322 at 10.3125 GHz such that the magnitude of high power peak 422 is suppressed compared to high power peak 222 of FIG. 2B and is further suppressed compared to high power peak 322 of FIG. 3B. In this illustrative embodiment, the magnitude of high power peak 322 is reduced by approximately 16 dB compared to high power peak 222 of FIG. 2B. Circuit assembly 400 demonstrates reduced EM radiation at 10.3125 GHz compared to circuit assembly 300 of FIG. 3A and further reduced EM radiation at 10.3125 GHz compared to circuit assembly 200 of FIG. 2A.

Figure 5:
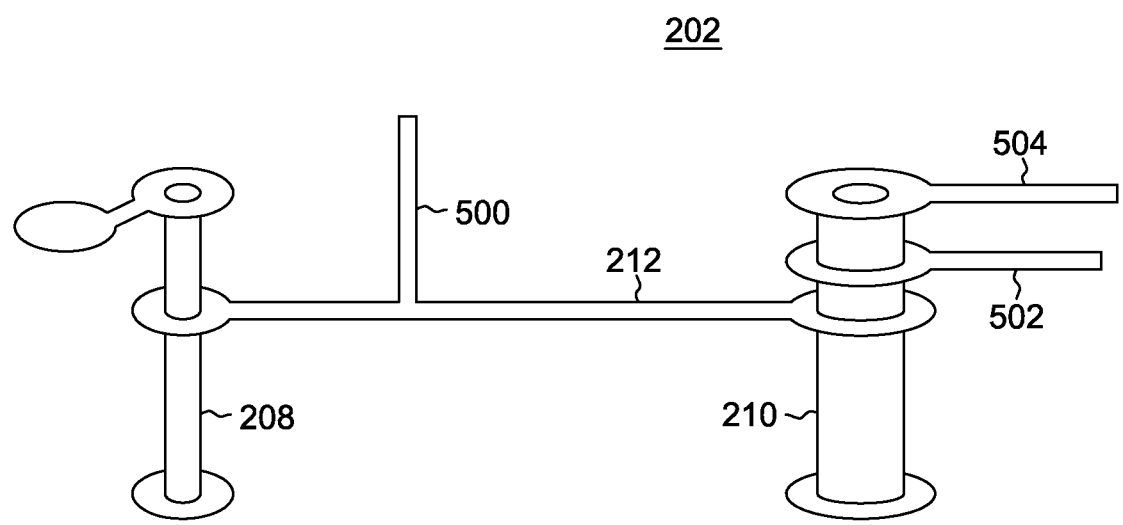
FIG. 5 illustrates PCB 202 of FIG. 2A with alternative transmission line stubs in accordance with embodiments of the invention.

FIG. 5 illustrates PCB 202 of FIG. 2A with alternative transmission line stubs 500, 502, and 504 in accordance with embodiments of the invention. In various embodiments, a transmission line stub, as described with reference to FIG. 1A as transmission line stub 104, may be included as part of the PCB design and fabricated on various layers of the PCB, such as PCB 202. In one embodiment, the transmission line stub, depicted as transmission line stub 500, can be electrically coupled to transmission line 212. It should be appreciated by someone skilled in the art that the effective dielectric constant used to determine the electrical wavelength in the equation above is the dielectric constant of the materials used to fabricate PCB 202. In another embodiment, the transmission line stub, depicted as transmission line stub 502, can be electrically coupled to a PTH, for example PTH 210, and fabricated on a different layer in PCB 202 from transmission line 212. In another embodiment, the transmission line stub, depicted as transmission line stub 504, can be electrically coupled to a PTH, for example PTH 210, and fabricated on a surface layer of PCB 202. In another embodiment, a transmission line stub may be a wire (not shown) attached, for example, by soldering an end of the wire to the surface land of a conductive via. It should be appreciated by someone skilled in the art that the depicted locations of transmission line stubs 500, 502, and 504 represent alternate embodiments of the invention and are not necessarily implemented in the same embodiment.

It should be appreciated by someone skilled in the art that if the addition of transmission line stubs includes differential signal pairs, the transmission line stubs are symmetrical to each other and their surrounding structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a transmission line stub based on one quarter of the electrical wavelength of the second harmonic frequency of a transmitted signal (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A transmission circuit comprising:
   a transmission line electrically coupling a first conductive via and a second conductive via, the first conductive via having a first via stub, wherein the transmission line configured to transmit a signal is coupled to the first conductive via towards a first end of the transmission line, and wherein the first via stub extends beyond the transmission line, the second conductive via having a second via stub, wherein the transmission line configured to transmit a signal is coupled to the second conductive via towards a second end of the transmission line, and wherein the second via stub extends beyond the transmission line;
   a transmitter chip electrically coupled towards a first end of the first conductive via, the transmitter chip having at least one transmitter lane;
   a connector electrically coupled towards a first end of the second conductive via; and
   a transmission line stub electrically coupled towards a second end of one of the first and second via stubs,
   wherein a combined length of the transmission line stub and the one of the first and second via stubs is configured to suppress a preselected frequency,
   wherein the first and second via stubs are unterminated via stubs.

2. The transmission circuit of claim 1, wherein the preselected frequency is a second harmonic of a fundamental frequency.

3. The transmission circuit of claim 2, wherein the fundamental frequency is determined by a data transmission rate.

4. The transmission circuit of claim 2, wherein a time delay of the transmission line stub is substantially equal to one quarter cycle of the second harmonic frequency.

5. The transmission circuit of claim 2, wherein the length of the transmission line stub, electrically coupled to the transmission line, substantially equals one quarter the electrical wavelength of the second harmonic frequency.

6. A transmission circuit that includes a transmission line and a conductive via, the transmission circuit comprising:
   a transmission line electrically coupling a first conductive via and a second conductive via;
   the first conductive via that includes a first via stub, wherein the transmission line configured to transmit a signal is coupled to the first conductive via, and wherein the first via stub extends beyond the transmission line;
   the second conductive via that includes a second via stub, wherein the transmission line configured to transmit a signal is coupled to the second conductive via, and wherein the second via stub extends beyond the transmission line; and
   a transmission line stub electronically coupled to at least one of the first conductive via, or the second conductive via, wherein the length of the transmission line stub is configured to suppress a preselected frequency.

7. The transmission circuit of claim 6, wherein the preselected frequency is a second harmonic of a fundamental frequency.

8. The transmission circuit of claim 7, wherein the fundamental frequency is determined by a data transmission rate.

9. The transmission circuit of claim 7, wherein a time delay of the transmission line stub is substantially equal to one quarter cycle of the second harmonic frequency.

10. The transmission circuit of claim 9, wherein the transmission line stub is electronically coupled to the via stub.

11. The transmission circuit of claim 10, wherein the sum of the time delays of the transmission line stub and the via stub is substantially equal to one quarter cycle of the second harmonic frequency.

12. The transmission circuit of claim 6, wherein the transmission line stub is an unterminated circuit trace located on the surface of a printed circuit board.

13. The transmission circuit of claim 6, wherein the transmission line stub is an unterminated circuit trace on a signal plane of a printed circuit board.

14. The transmission circuit of claim 6, wherein the transmission line stub is a wire attached to a surface land of the conductive via.

15. The transmission circuit of claim 6, wherein the conductive via is a plated through hole.

16. The transmission circuit of claim 6 comprising:
a transmitter chip electrically coupled towards a first end of the first conductive via, the transmitter chip having at least one transmitter lane; and
a connector electrically coupled towards a first end of the second conductive via,
wherein the transmission is coupled to the first conductive via towards a first end of the transmission line,
wherein the transmission line is coupled to the second conductive via towards a second end of the transmission line,
wherein the first and second via stubs are unterminated via stubs.

17. A transmission circuit comprising:
a transmission line electrically coupled to a first plated through hole at a first end of the transmission line and electrically coupled to a second plated through hole at a second end of the transmission line, the first plated through hole having a first via stub which extends beyond the transmission line and the second plated through hole having a second via stub-which extends beyond the transmission line;
a transmitter chip electrically coupled to the first plated through hole, the transmitter chip having at least one transmitter lane;
a connector electrically coupled to the second plated through hole;
a first transmission line stub electrically coupled to the first via stub; and
a second transmission line stub electrically coupled to the second via stub,
wherein a first combined length of the first transmission line stub and the first via stub is configured to suppress a first preselected frequency and a second combined length of the second transmission line stub and the second via stub is configured to suppress a second preselected frequency,
wherein the transmission line is configured to transmit a signal,
wherein the first and second via stubs are unterminated via stubs,
wherein the preselected frequency is a second harmonic of a fundamental frequency,
wherein the fundamental frequency is determined by a data transmission rate.

\* \* \* \* \*